United States Patent
Kim et al.

(10) Patent No.: US 7,765,669 B2
(45) Date of Patent: Aug. 3, 2010

(54) METHOD OF FORMING SHADOW MASK PATTERN

(75) Inventors: Jin Kyoo Kim, Suwon (KR); Sang Jin Han, Suwon (KR); Hee Cheol Kang, Suwon (KR); Eu Gene Kang, Suwon (KR); Tae Hyung Kim, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1247 days.

(21) Appl. No.: 11/325,312

(22) Filed: Jan. 5, 2006

(65) Prior Publication Data

US 2006/0158088 A1 Jul. 20, 2006

(30) Foreign Application Priority Data

Jan. 5, 2005 (KR) .................. 10-2005-0000960

(51) Int. Cl.
*B23P 11/02* (2006.01)
*H01L 21/00* (2006.01)
(52) U.S. Cl. ......................... 29/448; 313/402
(58) Field of Classification Search ............. 29/448, 29/469, 592.1, 601, 603.13, 603.15, 603.16, 29/603.18, 609; 313/402; 438/22
See application file for complete search history.

(56) References Cited

U.S. PATENT DOCUMENTS 5,827,775 A 10/1998 Miles et al.

FOREIGN PATENT DOCUMENTS

| CN | 1453389 | 11/2003 |
| JP | 08035077 | * 2/1996 |

OTHER PUBLICATIONS

Chinese Office Action dated Oct. 24, 2008.

* cited by examiner

*Primary Examiner*—John C Hong
(74) *Attorney, Agent, or Firm*—H.C. Park & Associates, PLC

(57) ABSTRACT

Disclosed is a method of forming a pattern on a mask sheet including an attaching portion to be attached to a mask frame, and a pattern area in which the pattern is formed. The method includes positioning the mask sheet on an auxiliary sheet with a thickness greater than the thickness of the mask sheet, fastening the auxiliary sheet to the mask frame, applying a stretching force to the mask sheet and the auxiliary sheet, and forming the pattern on the pattern area of the mask sheet. Thus, a predetermined pattern is formed on a mask sheet while a uniformly distributed external force is applied to the mask sheet, so that bending or deflecting out of plane by the mask sheet is prevented, thereby forming a precise mask pattern.

6 Claims, 3 Drawing Sheets

METHOD OF FORMING SHADOW MASK PATTERN

CROSS REFERENCE TO RELATED APPLICATIONS

This application claims priority to and the benefit of Korean Patent Application No. 2005-0000960, filed Jan. 5, 2005, which is hereby incorporated by reference for all purposes as if fully set forth herein.

BACKGROUND OF THE INVENTION

1. Field of the Invention

The present invention relates to a method of forming a pattern of a mask used in depositing an organic material on a pattern area of an organic electroluminescent display, and more particularly, to a method of forming a shadow mask pattern, in which tension is uniformly applied to a pattern area while a pattern is spirally formed in a mask for organic material layer deposition, thereby preventing the pattern from bending or deflecting out of plane.

2. Discussion of the Background

An electroluminescent display, which is a type of flat panel display, can be classified as either an inorganic electroluminescent display or an organic electroluminescent display, according to the type of material used as an emission layer. Recently, the organic electroluminescent display has been used because it can be driven with a low voltage, be lightweight and thin, have a wide viewing angle and have a fast response time for displaying images.

A conventional organic electroluminescent display has an organic electroluminescent device with an anode, an organic material layer, and a cathode stacked on a substrate. The organic material layer includes an organic emission layer, which emits light when a hole recombines with an electron. To transport the hole and the electron to the emission layer and improve emission efficiency, an electron injection layer and an electron transporting layer can be interposed between the cathode and the organic emission layer, and a hole injection layer and a hole transporting layer can be interposed between the anode and the organic emission layer.

An organic electroluminescent device with this configuration can be fabricated by a physical vapor deposition method, including a vacuum deposition method, an ion plating method, or a sputtering method, or by a chemical vapor deposition method using gas reaction. When the organic electroluminescent device is fabricated using one of these methods, a mask with a pattern can be used to deposit the organic material layers in a desired position on a substrate. The mask can be fixed on a mask frame and under tension.

Referring to FIG. 1, to form an organic material layer (not shown) in a pattern on one side of a substrate 1, a mask 3 with a pattern area 3a, where the pattern area 3a pattern corresponds to the pattern of the organic material layer to be formed, can be fastened to a mask frame 5 by, for example, welding, so that the mask 3 is tensioned in the directions shown by arrows 'A'. Then, a gaseous organic material can be supplied from an organic material effusion cell (not shown) in the direction shown by arrow 'B', and the gaseous organic material can be deposited on the substrate 1 through an opening 5a of the mask frame 5 and through the pattern area 3a of the mask 3, thereby forming the organic material layer with a pattern that corresponds to the pattern of pattern area 3a. A mask attaching portion 3b is positioned along the perimeter of, and separate from, the pattern area 3a, and a mask frame attaching portion 5b is positioned along the perimeter, and separate from, the opening 5a. The mask frame 5 and is fastened to the mask 3 by fastening the mask attaching portion 3b and the mask frame attaching portion.

As shown in FIG. 2, a mask pattern can be formed on a mask 3' by a pattering forming device (not shown). When the mask 3' is fastened to the mask frame 5 to form the mask pattern on the mask 3', the pattern forming device is moved from a first side to a second side of the pattern area 3a' of the mask sheet 3', for example in a direction shown by arrow 'C,' while a tension force is applied to the mask 3' in a direction shown by arrow A.

Where the mask pattern is formed on the mask 3' as described above, the tension applied to the mask 3' creates a reduction in pattern area 3a' stiffness between adjacent patterns. Thus, as the mask pattern is formed on the mask 3' under tension in directions shown by arrows A, the stiffness of the mask pattern previously formed is reduced, thus resulting in non-uniform stiffness across the mask pattern.

The non-uniform stiffness can then result in the mask 3' being bent or deflected out of plane due to the applied tension. Particularly, distortion of the mask 3' can occur when the mask pattern is formed for thin film deposition, thus making it difficult to form the desired mask pattern on the mask 3'.

SUMMARY OF THE INVENTION

The present invention provides a method of forming a shadow mask pattern, in which tension is uniformly applied to a pattern area while a pattern is formed in a mask for organic material layer deposition, thereby preventing the pattern from bending or deflecting out of plane.

Additional features of the invention will be set forth in the description which follows, and in part will be apparent from the description, or may be learned by practice of the invention.

The present invention discloses a method of forming a pattern on a mask sheet including an attaching portion fastened to a mask frame, and a pattern area in which the pattern is formed. The method includes positioning the mask sheet on an auxiliary sheet with a thickness greater than the thickness of the mask sheet, fastening the auxiliary sheet to the mask frame, applying a stretching force to the mask sheet and the auxiliary sheet, and forming the pattern on the pattern area of the mask sheet.

The present invention also discloses a method of forming a pattern on a mask sheet including an attaching portion comprising a hole to reduce tension in the mask sheet and fastened to a mask frame, and a pattern area in which the pattern is formed. The method includes applying a stretching force to the mask sheet, and forming the pattern on the pattern area of the mask sheet.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
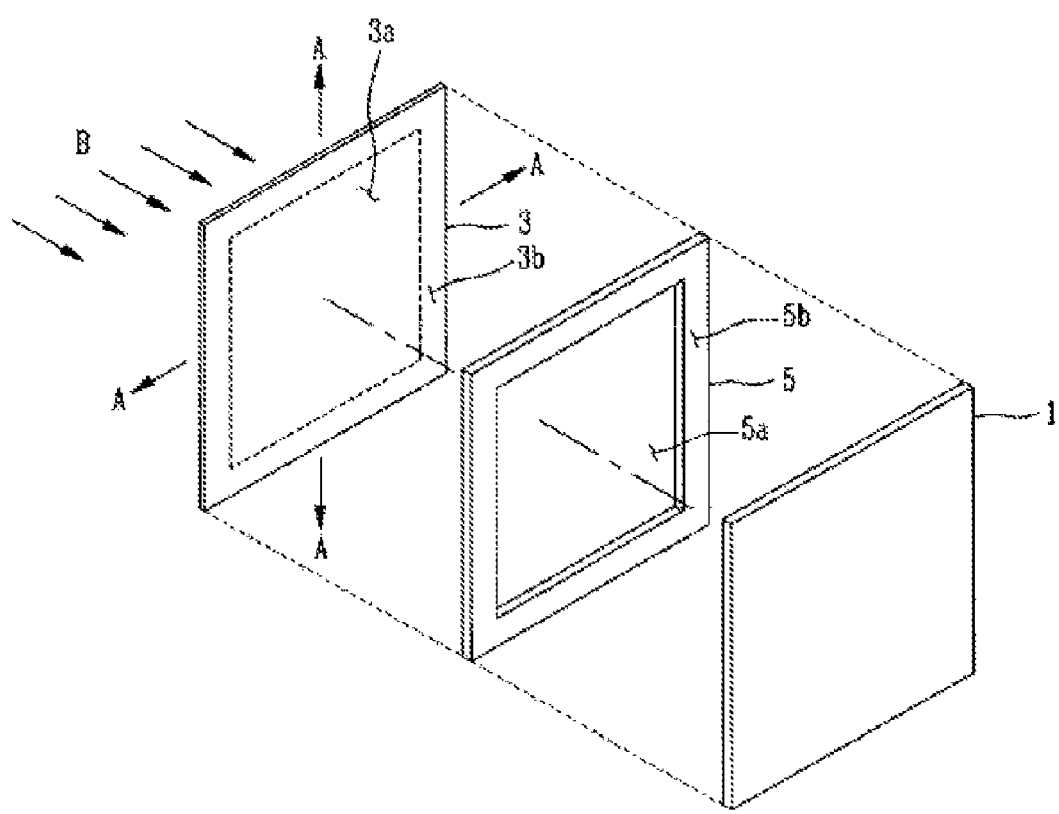
FIG. 1 shows an exploded perspective view schematically illustrating a general fixed state of a mask to fabricate an organic electroluminescent device.
Figure 2:
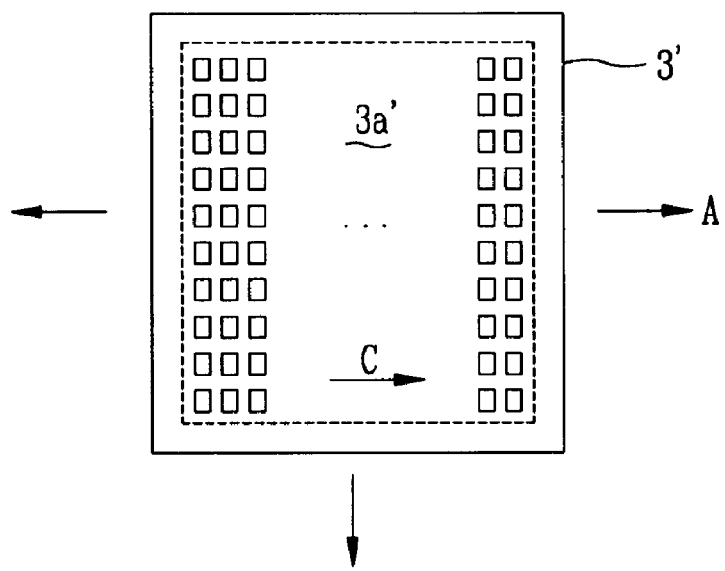
FIG. 2 schematically illustrates that pattern formed on a conventional mask sheet.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like numbers refer to the same or similar components in the figures.

Hereinafter, an 'mask sheet' means a steel plate to be formed with a pattern, a 'mask' means a steel plate formed with a pattern, and a 'mask pattern' means a pattern formed on a mask sheet.

In a method of forming a mask pattern according to an embodiment of the present invention, a mask sheet to be formed with a pattern is first fastened to a mask frame (not shown). Then, an external tension force A is applied to the mask sheet. Therefore, the mask pattern can be aligned with a substrate by applying the tension while the mask is fastened to the mask frame.

Then, a pattern forming device (not shown) such as a water-jet type laser device can be used to form a mask pattern on the mask sheet fastened to the mask frame. Forming the pattern on the mask sheet thereby forms the mask for fabricating an organic electroluminescent device. Prior to forming the mask pattern, an initial point can be selected where the mask pattern will begin to be formed on the mask sheet. The initial position is subject to uniform tension 'A' applied to the mask sheet. From the initial point, the pattern forming device moves along an approximately spiral line, thereby forming a mask pattern on the mask sheet.

Figure 3A:
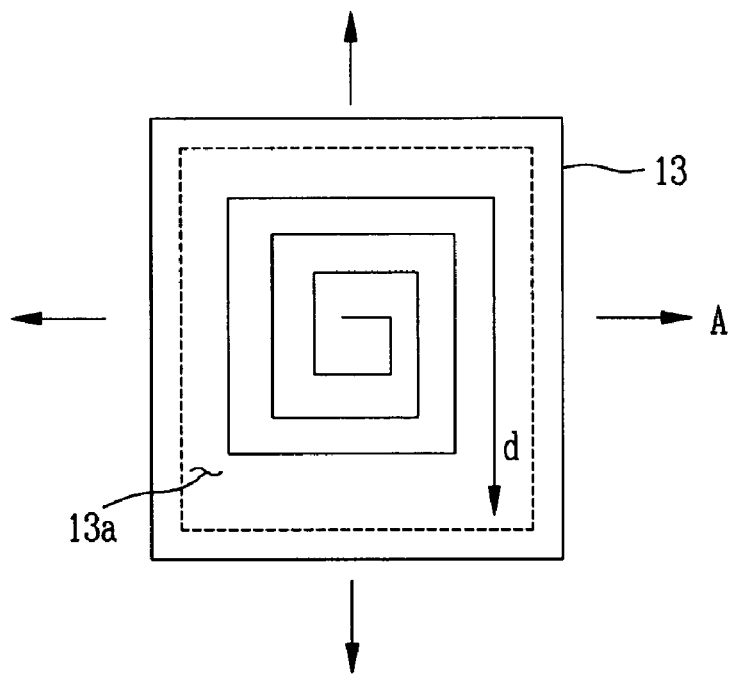
FIG. 3A and FIG. 3B schematically illustrate a process of forming a pattern on a mask sheet along a spiral line according to an embodiment of the present invention.

As shown in FIG. 3A, the initial point for forming the mask pattern can be positioned in approximately the center of a pattern area 13a of the mask sheet 13. The pattern forming device, such as a perforator, can then transit spirally along a pattern forming line 'd', shown as a solid line, to form the mask pattern on the pattern area 13a of the mask sheet 13.

Here, a distance from the mask patterns formed on the pattern area 13a of the mask sheet 13 to a position where the external force 'A' is applied is approximately equivalently maintained, so that the tension is approximately uniformly applied to the mask sheet, thereby preventing the mask pattern from being bent or deflecting out of plane.

Figure 3B:
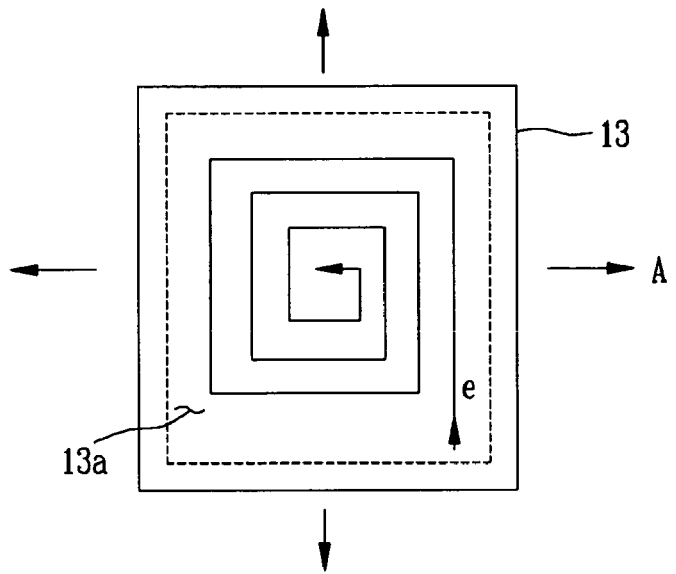

As shown in FIG. 3B, where the initial point for forming the mask pattern can be positioned in approximately one corner of the pattern area 13a of the mask sheet 13. The pattern forming device, such as a perforator, can then transit spirally along a pattern forming line 'e', shown as a solid line, to form the mask pattern on the pattern area 13a of the mask sheet 13.

Here, a distance from the mask patterns formed on the pattern area 13a of the mask sheet 13 to a position where the external force 'A' is applied is approximately equivalently maintained, so that the tension is approximately uniformly applied to the mask sheet 13, thereby preventing the pattern from being bent or deflecting out of plane.

Figure 4:
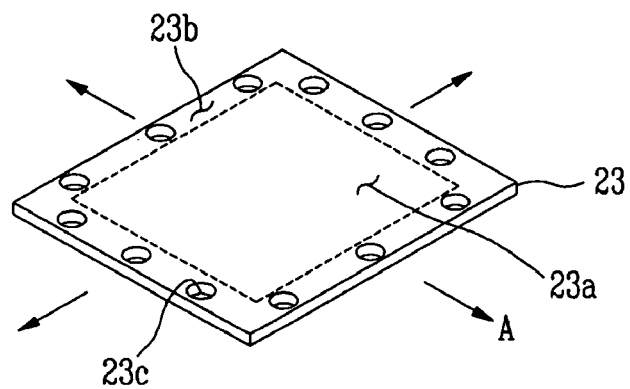
FIG. 4 illustrates that a pattern is formed on a mask sheet according to a first embodiment of the present invention.

According to an embodiment of the present invention, as shown in FIG. 4, to uniformly apply tension to a mask sheet 23 while a mask pattern is formed on a pattern area 23a of the mask sheet 23, the mask sheet 23 can have a hole 23c, such as a slit having a predetermined size, in a mask attaching portion 23b thereof. Then, a mask pattern can be formed on the pattern area 23a of the mask sheet 23 by a pattern forming device.

As the mask pattern is formed on the pattern area 23a, the tension applied to the pattern area 23b is reduced by the presence of the hole 23c to allow the pattern to be formed on the pattern area 23a without any bending or deflection out of plane.

Consequently, when the mask pattern is formed on the pattern area 23a of the mask sheet 23 by the pattern forming device, the initial point can be selected to evenly apply the tension 'A' to the mask sheet 23, and the pattern forming device can move along an approximately spiral line. As described above, the spiral line can start from approximately the center of the pattern area 23a and transit spirally outward toward the edge as shown in FIG. 3A, or from approximately one corner of the pattern area 23a and transit spirally inward toward the center thereof as shown in FIG. 3B.

Figure 5:
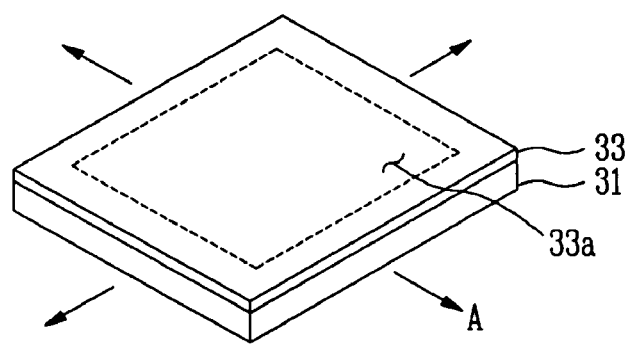
FIG. 5 illustrates a pattern formed on a mask sheet according to a second embodiment of the present invention.

According to another embodiment of the present invention, as shown in FIG. 5, to uniformly apply tension to a mask sheet 33 while a mask pattern is formed on a pattern area 33a of the mask sheet 33, the mask sheet 33 can be fastened to an auxiliary sheet 31 with a thickness greater than the thickness of the mask sheet 33. Thus, the tension 'A' is transferred to the auxiliary sheet 31. Then, a mask pattern can be formed on the pattern area 33a of the mask sheet 33.

Thus, even though the tension may be non-uniformly applied to the mask sheet 33 while the mask pattern is formed by the pattern forming device, the auxiliary sheet 31 can compensate for the non-uniform tension, thereby allowing a desired pattern to be formed on the mask sheet 33 without any bending or deflection out of plane.

Consequently, when the mask pattern is formed on the mask sheet 33 placed on the auxiliary sheet 31, an initial point is set and the tension 'A' is applied uniformly to the mask sheet 33, so that the pattern forming device is moved along the approximately spiral line, thereby forming a desired mask pattern. As described above, the spiral line can be started from approximately the center of the pattern area 23a and move spirally outward toward the edge thereof as shown in FIG. 3A, or approximately from one corner of the pattern area 23a and move spirally inward toward the center thereof as shown in FIG. 3B.

The mask sheet 13, 23, 33 may be made of a stainless steel material, such as invar containing a high fraction of nickel or elinvar containing a high fraction of nickel and chrome. Alternatively, a representative stainless steel material can be selected from a group consisting of SUS 304, SUS 430 and SUS 304+SUS 430. Further, a material used to form the mask sheet can have a low thermal expansion coefficient and can be magnetized.

The perforations of the mask pattern formed on the pattern area of the mask sheet can be individually formed in a shape of a dot or a rectangle. Alternatively, the dot-shaped pattern and the rectangle-shaped pattern may be mixed.

As described above, according to the embodiments of the present invention, when a predetermined pattern is formed on a mask sheet while an external force is applied to the mask sheet, tension applied to the mask sheet can be uniformly distributed, so that the mask sheet does not bend or deflect out of plane, thereby forming a precise mask pattern.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of forming a pattern on a mask sheet including an attaching portion fastened to a mask frame, and a pattern area in which the pattern is formed, the method comprising:
    positioning the mask sheet on an auxiliary sheet with a thickness greater than the thickness of the mask sheet;
    fastening the auxiliary sheet to the mask frame;
    applying a stretching force to the mask sheet and the auxiliary sheet; and
    forming the pattern on the pattern area of the mask sheet.

2. The method of claim 1, wherein the forming the pattern comprises:
    setting an initial point to start forming the pattern on the pattern area of the mask sheet; and
    forming the pattern along a spiral line from the initial point.

3. The method of claim 2, wherein the initial point is approximately the center of the pattern area of the mask sheet, and the spiral line transits spirally outward toward an edge thereof.

4. The method of claim 2, wherein the initial point is approximately an edge of the pattern area of the mask sheet, and the spiral line transits spirally inward toward the center thereof.

5. The method of claim 1, wherein the stretching force is applied bi-directionally to the mask sheet and the auxiliary sheet.

6. The method of claim 1, wherein the mask sheet is formed of invar, elinvar, or a stainless steel selected from the group consisting of SUS 304, SUS 430 and SUS 304+SUS 430.

* * * * *